United States Patent
Pirovano et al.

(10) Patent No.: US 10,461,125 B2
(45) Date of Patent: Oct. 29, 2019

(54) THREE DIMENSIONAL MEMORY ARRAYS

(71) Applicant: Micron Technology, Inc., Boise, ID (US)

(72) Inventors: Agostino Pirovano, Milan (IT); Andrea Redaelli, Casatenovo (IT); Fabio Pellizzer, Boise, ID (US); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/689,155

(22) Filed: Aug. 29, 2017

(65) Prior Publication Data

US 2019/0067371 A1 Feb. 28, 2019

(51) Int. Cl.
*H01L 27/24* (2006.01)
*H01L 45/00* (2006.01)
*H01L 27/115* (2017.01)

(52) U.S. Cl.
CPC ........ *H01L 27/2409* (2013.01); *H01L 27/115* (2013.01); *H01L 27/249* (2013.01); *H01L 27/2436* (2013.01); *H01L 45/04* (2013.01); *H01L 45/147* (2013.01)

(58) Field of Classification Search
CPC .............. H01L 27/11568; H01L 27/11582
See application file for complete search history.

(56) References Cited

U.S. PATENT DOCUMENTS

| | | |
|---|---|---|
| 6,869,841 B2 | 3/2005 | Xu |
| 6,906,940 B1 | 6/2005 | Lue |
| 7,382,647 B1 | 6/2008 | Gopalakrishnan |
| 7,800,091 B2 | 9/2010 | Kamigaichi et al. |
| 7,910,914 B2 | 3/2011 | Tanaka et al. |
| 7,943,515 B2 | 5/2011 | Scheuerlein |
| 7,989,789 B2 | 8/2011 | Toda |
| 8,124,968 B2 | 2/2012 | Koo et al. |
| 8,173,987 B2 | 5/2012 | Lung |

(Continued)

FOREIGN PATENT DOCUMENTS

| | | |
|---|---|---|
| JP | 2007067403 A | 3/2007 |
| JP | 2008181978 A | 8/2008 |

(Continued)

OTHER PUBLICATIONS

Supplementary Search Report from related European patent application No. 13833302.6, dated Apr. 1, 2016, 7 pp.

(Continued)

*Primary Examiner* — Matthew L Reames
*Assistant Examiner* — John A Bodnar
(74) *Attorney, Agent, or Firm* — Brooks, Cameron & Huebsch, PLLC

(57) ABSTRACT

In an example, a memory array may include a plurality of first dielectric materials and a plurality of stacks, where each respective first dielectric material and each respective stack alternate, and where each respective stack comprises a first conductive material and a storage material. A second conductive material may pass through the plurality of first dielectric materials and the plurality of stacks. Each respective stack may further include a second dielectric material between the first conductive material and the second conductive material.

18 Claims, 8 Drawing Sheets

(56) References Cited

U.S. PATENT DOCUMENTS

| | | | |
|---|---|---|---|
| 8,188,517 B2 | 5/2012 | Choi | |
| 8,194,433 B2 | 6/2012 | Parkinson | |
| 8,198,667 B2 | 6/2012 | Kuniya et al. | |
| 8,208,279 B2 | 6/2012 | Lue | |
| 8,299,571 B2 | 10/2012 | Ozawa et al. | |
| 8,450,713 B2 | 5/2013 | Awaya et al. | |
| 8,502,184 B2 | 8/2013 | An et al. | |
| 8,728,893 B2 | 5/2014 | Son et al. | |
| 8,729,523 B2 | 5/2014 | Pio | |
| 8,729,624 B2 | 5/2014 | Fukuzumi et al. | |
| 8,841,649 B2 | 9/2014 | Pio | |
| 9,252,362 B2 | 2/2016 | Pio | |
| 9,444,046 B2 | 9/2016 | Pio | |
| 9,960,045 B1* | 5/2018 | Purayath | H01L 29/0649 |
| 2002/0132417 A1* | 9/2002 | Li | H01L 45/085 438/237 |
| 2006/0073652 A1 | 4/2006 | Pellizzer et al. | |
| 2006/0110878 A1 | 5/2006 | Lung et al. | |
| 2007/0096090 A1 | 5/2007 | Dennison | |
| 2009/0097321 A1 | 4/2009 | Kim et al. | |
| 2009/0302303 A1 | 12/2009 | Lowrey | |
| 2010/0012916 A1 | 1/2010 | Kuo et al. | |
| 2010/0163822 A1 | 7/2010 | Ovshinsky et al. | |
| 2010/0252909 A1 | 10/2010 | Nakanishi et al. | |
| 2010/0259970 A1 | 10/2010 | Toda et al. | |
| 2010/0270529 A1 | 10/2010 | Lung | |
| 2010/0270593 A1 | 10/2010 | Lung et al. | |
| 2011/0140068 A1 | 6/2011 | Ozawa et al. | |
| 2011/0140070 A1* | 6/2011 | Kim | G11C 5/02 257/5 |
| 2011/0147690 A1 | 6/2011 | Yang | |
| 2011/0215394 A1 | 9/2011 | Komori et al. | |
| 2011/0272663 A1 | 11/2011 | An et al. | |
| 2011/0299321 A1 | 12/2011 | Murooka | |
| 2011/0299328 A1 | 12/2011 | Liu | |
| 2012/0025164 A1 | 2/2012 | Deweerd et al. | |
| 2012/0256154 A1 | 10/2012 | Dennison et al. | |
| 2012/0287697 A1 | 11/2012 | Hanzawa et al. | |
| 2012/0298946 A1 | 11/2012 | Magistretti et al. | |
| 2013/0093005 A1 | 4/2013 | Yun et al. | |
| 2014/0043911 A1 | 2/2014 | Samachisa et al. | |
| 2014/0061574 A1 | 3/2014 | Pio | |
| 2014/0061575 A1 | 3/2014 | Pio | |
| 2014/0264553 A1 | 9/2014 | Min et al. | |
| 2015/0249093 A1* | 9/2015 | Lee | H01L 27/11582 257/324 |
| 2015/0311301 A1 | 10/2015 | Seol et al. | |
| 2015/0348991 A1 | 12/2015 | Simsek-Ege et al. | |
| 2016/0104720 A1 | 4/2016 | Alsmeier | |
| 2016/0190150 A1* | 6/2016 | Chu | H01L 27/11565 257/324 |
| 2017/0117290 A1* | 4/2017 | Lee | H01L 27/11582 |
| 2017/0125484 A1 | 5/2017 | Pellizzer | |

FOREIGN PATENT DOCUMENTS

| | | | |
|---|---|---|---|
| JP | 2009081251 A | 4/2009 | |
| JP | 2010282673 A | 12/2010 | |
| JP | 2010287872 A | 12/2010 | |
| JP | 2011090758 A | 5/2011 | |
| JP | 2011129639 A | 6/2011 | |
| JP | 2011253941 A | 12/2011 | |
| KR | 20080096432 A | 10/2008 | |
| KR | 20100001260 A | 1/2010 | |
| KR | 10-20110001487 A | 1/2011 | |
| KR | 20110034946 A | 4/2011 | |
| KR | 10-20110123005 A | 11/2011 | |
| KR | 1020120094339 A | 8/2012 | |
| TW | I222146 B | 10/2004 | |
| TW | 200945564 A | 11/2009 | |
| TW | 200947680 A | 11/2009 | |
| TW | 200951951 A | 12/2009 | |
| TW | 201039476 A | 11/2010 | |
| TW | 201624623 A | 7/2016 | |

OTHER PUBLICATIONS

Notice of Reasons for Rejection from related Korean patent application No. 10-2015-7006865, dated Mar. 17, 2016, 13 pp.

Office Action from related Taiwan patent application No. 102131392, dated Jun. 29, 2015, 18 pp.

Office Action from related Taiwan patent application No. 102131392, dated Feb. 12, 2015, 14 pp.

International Search Report and Written Opinion of international application No. PCT/US2013/057657, dated Dec. 27, 2013, 16 pp.

Chen, et al. "An access-transistor-free (0T/1R) non-volatile resistance random access memory (RRAM) using a novel threshold switching, self-rectifying chalcogenide device," IEEE International Electron Devices Meeting, IEDM Technical Digest '03, Dec. 2003, 4 pp.

Kau, et al., "A Stackable Cross Point Phase Change Memory," IEEE International Electron Devices Meeting, IEDM Technical Digest '09, Dec. 2009, 4 pp.

Lu, NTUEE Electronics downloaded from URL < http://cc.ee.ntu.edu.tw/~lhlu/eecourses/Electronics1/Electronics_Ch3.pdf > on Nov. 2, 2013, 14 pp.

Raoux, et al. "Phase-change random access memory: A scalable technology," IBM Journal of Research and Development, vol. 52, No. 4/5, pp. 465-479, Jul./Sep. 2008.

Ou, "Arrary Architecture for Non-Volatile 3-Dimensional Cross Point Memory", Diss, Stanford University Department of Electrical Engineering Mar. 2010, 119 pp.

Endoh, et al. "Novel ultra high density flash memory with a stacked-surrounding gate transistor (S-SGT) structured cell," IEEE International Electron Devices Meeting, 2001. IEDM Technical Digest '01, IEEE transactions on electron devices, vol. 50. No. 4, published Apr. 2003, 7 pp.

Definition of 'Intersect' downloaded from URL , http://www.merriam-webster.com/dictionary/intersect. on Jun. 1, 2015.

Definition of Protrude downloaded from URL < http://www/merriam-webster.com/dictionary/protrude > on Jun. 1, 2015.

Czubatyj, et al. "Invited Paper: Thin-Film Ovanic Threshold Switch: Its Operation and Application in Modern Integrated Circuits", Electronic Materials Letters, vol. 8, No. 2, published 2012, pp. 157-167.

Wong, et al. "Phase Change Memory", Proceedings of the IEEE, vol. 98, No. 12, pp. 2201-2227, Dec. 2010.

Supplementary Search Report from related European patent application No. 13832624.4, dated Mar. 29, 2016, 10 pp.

Office Action from related Japanese patent application No. 2015-530113, dated May 10, 2016, 9 pp.

Office Action from Japanese patent application No. 2015-530120, dated May 31, 2016, 16 pp.

Anbarasu et al., "Understanding the Structure and Properties of Phase Change Materials for Data Storage Applications," Journal of the Indian Institute of Science, 91:2, pp. 259-274, Jun. 2011.

International Search Report and Written Opinion of international application No. PCT/US2013/057620, dated Dec. 11, 2013, 10 pp.

U.S. Appl. No. 15/088,475, entitled, "Thermal Insulation for Three-Dimensional Memory Arrays," filed Apr. 1, 2016, 43 pp.

International Search Report and Written Opinion from related international application No. PCT/US2018/047143, dated Jan. 9, 2019, 16 pp.

Office Action from related Taiwan patent application No. 107129879, dated Jun. 4, 2019, 3 pages.

* cited by examiner

THREE DIMENSIONAL MEMORY ARRAYS

TECHNICAL FIELD

The present disclosure relates generally to memory, and, more particularly, to three dimensional memory arrays.

BACKGROUND

Memories, such as memory devices, may typically be provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), resistance variable memory, and flash memory, among others. Types of resistance variable memory may include phase-change-material (PCM) memory, programmable-conductor memory, and resistive random-access memory (RRAM), among others.

Memory devices may be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells may be programmed to store data corresponding to a target data state by varying the resistance level of the resistive memory element. Resistive memory cells may be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell may be determined by sensing current through the cell responsive to an applied interrogation voltage. The sensed current, which varies based on the resistance level of the cell, can indicate the state of the cell.

One of a number of data states (e.g., resistance states) may be set for a resistive memory cell. For example, a single level memory cell (SLC) may be programmed to a targeted one of two different data states, which may be represented by the binary units 1 or 0 and can depend on whether the cell is programmed to a resistance above or below a particular level. As an additional example, some resistive memory cells may be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1A:
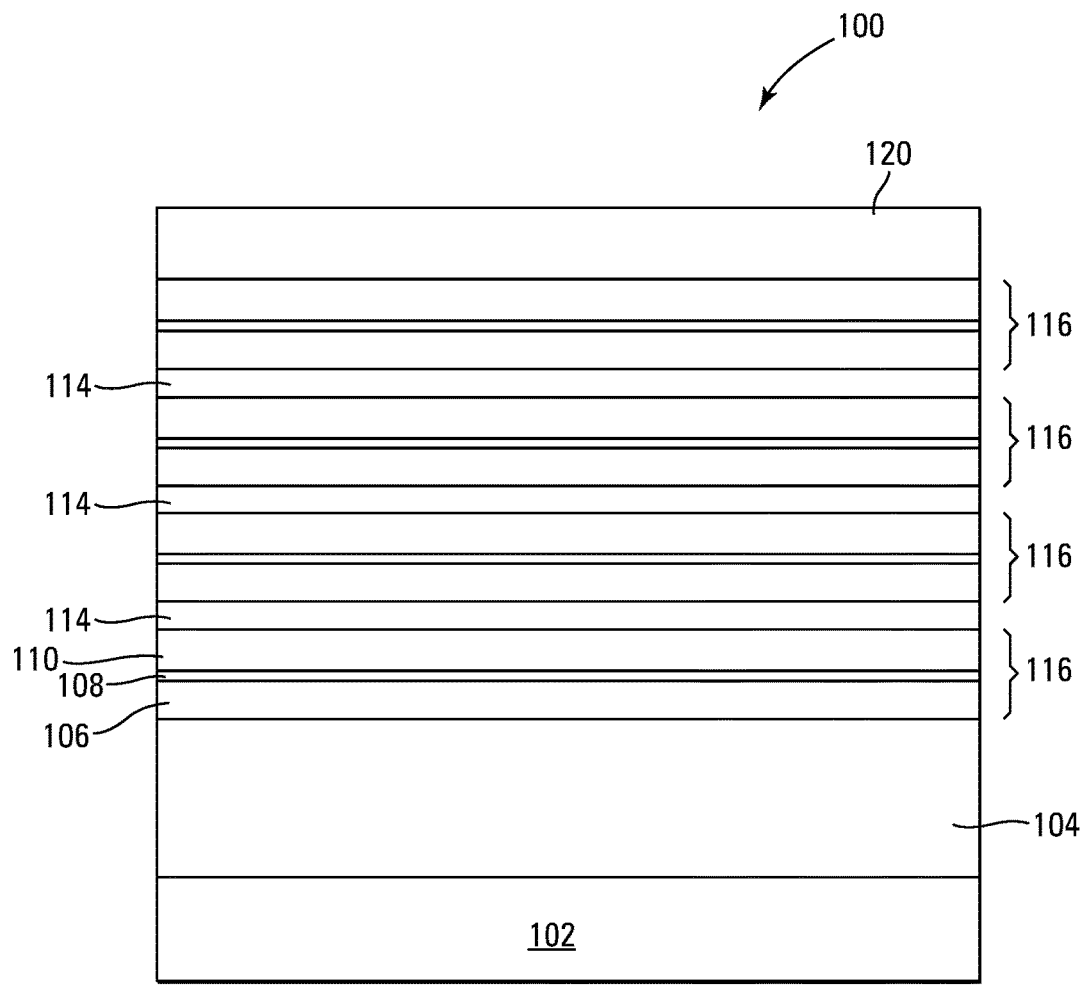
FIGS. 1A-1D illustrate cross-sectional views of processing steps associated with forming a three dimensional memory array, in accordance with an embodiment of the present disclosure.

The present disclosure includes three dimensional memory arrays and methods of processing the same. A number of embodiments include a memory array that may include a plurality of first dielectric materials and a plurality of stacks, where each respective first dielectric material and each respective stack alternate, and where each respective stack comprises a first conductive material and a storage material. A second conductive material may pass through the plurality of first dielectric materials and the plurality of stacks. Each respective stack may further include a second dielectric material between the first conductive material and the second conductive material.

In examples of previous memory arrays, a storage material may be formed in a (e.g., vertical) opening passing through a stack of alternating (e.g., horizontal) first conductive materials and dielectric materials. A second conductor may be formed in the opening containing the storage material. Memory cells of an array may include different portions of the first conductors, different portions of the storage material, and different portions of the second conductor, such that the array may include (e.g., vertical) stacks of memory cells to form a three-dimensional array. Utilizing such stacks to form a three dimensional memory array may increase the number of memory cells in the array that may provide increased density and/or increased storage capacity.

However, it may be difficult to form a uniform thickness of the storage material in the opening (e.g., using standard techniques, such as physical vapor deposition (PVD)). Non-uniformities in the thickness of the storage material may, for example, result in non-uniformities in the electrical properties of the storage material, and thus of the memory cells of the array.

Embodiments of the present disclosure provide benefits, such as allowing for three dimensional memory arrays with storage material having more a uniform thickness, and thus more uniform electrical properties, than storage material formed in openings in previous memory arrays. For example, embodiments may allow for the formation of the storage material (e.g., having a relatively uniform thickness) using standard techniques, such as PVD, while still achieving increased density and/or storage capacity.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

As used herein, "a" or "an" may refer to one or more of something, and "a plurality of" can refer to more than one of such things. For example, a memory cell can refer to one or more memory cells, and a plurality of memory cells can refer to two or more memory cells.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

The term "vertical" may be defined, for example, as a direction that is perpendicular to a base structure, such as a surface of an integrated circuit die. It should be recognized the term vertical accounts for variations from "exactly" vertical due to routine manufacturing, measuring, and/or assembly variations and that one of ordinary skill in the art would know what is meant by the term vertical. The term "horizontal" may be defined, for example, as a direction that is parallel to the base structure. It should be recognized the term horizontal accounts for variations from "exactly" horizontal due to routine manufacturing, measuring, and/or assembly variations and that one of ordinary skill in the art would know what is meant by the term horizontal. It should be recognized the terms perpendicular and parallel respectively account for variations from "exactly" perpendicular and "exactly" parallel due to routine manufacturing, measuring, and/or assembly variations and that one of ordinary skill in the art would know what is meant by the terms perpendicular and parallel.

To meet the demand for higher capacity memories, designers continue to strive to increase memory density, such as the number of memory cells in a given area of a base structure (e.g., a base semiconductor, such as a semiconductor substrate, a silicon substrate, etc.), such as a die (e.g., a chip). One way to increase memory density is to form stacked memory arrays (e.g., often referred to as three dimensional memory arrays). For example, a stacked memory array may include memory cells stacked in a direction perpendicular to the base structure to increase the number of memory cells. There has been substantial interest in three-dimensional cross-point memory. In some examples, three-dimensional cross-point memory cells may utilize a resistive material, such as a phase-change material (e.g., chalcogenide), as a multistate material suitable for storing memory bits.

FIGS. 1A-1E are cross-sectional views of a portion of a stacked memory array 100 (e.g., three dimensional memory array), during various stages of processing (e.g., fabrication), in accordance with a number of embodiments of the present disclosure. In FIG. 1A, a dielectric material (e.g., a dielectric 102) may be formed over wiring (e.g., metallization levels) of an apparatus, such as a memory device. The wiring may be over decoder circuitry that may be formed on and/or in a semiconductor (not shown in FIG. 1A). Dielectric 102 may be over and may electrically isolate memory array 100 from the wiring, decoder, and semiconductor. For example, dielectric 102 may be over and may electrically isolate memory array 100 from complementary-metal-oxide-semiconductor (CMOS) and metallization levels. In some examples, dielectric 102 may act as an etch-stop. Herein a dielectric material may be referred to as a dielectric.

A (e.g., horizontal) dielectric 104 may be formed (e.g., flat deposited) adjacent to (e.g., over), such as in direct physical contact with, dielectric 102. Dielectrics 102 and 104 may be oxide, such as silicon oxide, aluminum oxide, hafnium oxide, etc., or nitride, such as silicon nitride.

Herein when a first element is adjacent to a second element, the first element may be over (e.g., above), below, or lateral to the second element and may be in direct physical contact with the second element with no intervening elements or may be separated from the second element by one or more intervening elements. When a first element is over a second element, the first element may be in direct physical contact with the second element or may be separated from the second element by one or more intervening elements.

A (e.g., horizontal) storage material 106 may be formed (e.g., flat deposited) over (e.g., on) dielectric 104, as shown in FIG. 1A. In some examples, storage material 106 may be formed using PVD, chemical vapor deposition (CVD), or atomic layer deposition (ALD). Storage material 106 may be about ten (10) nanometers thick, for example. Flat depositing storage material 106 (e.g., horizontally) may, for example, mitigate (e.g., eliminate) the (e.g., unacceptable) non-uniformities in the thickness of the storage material that may otherwise occur when a storage material is formed (e.g., vertically) in an opening.

Storage material 106 may include a chalcogenide material, such as a chalcogenide alloy and/or glass, that may be a self-selecting storage material (e.g., that can serve as both a select device and a storage element). Storage material 106 (e.g., the chalcogenide material) may be responsive to an applied voltage, such as a program pulse, applied thereto. For an applied voltage that is less than a threshold voltage, storage material 106 may remain in an "off" state (e.g., an electrically nonconductive state). Alternatively, responsive to an applied voltage that is greater than the threshold voltage, storage material 106 may enter an "on" state (e.g., an electrically conductive state). Further, the threshold voltage of storage material 106 in a given polarity may change based on the polarity (e.g., positive or negative) of the applied voltage. For example, the threshold voltage may change based on whether the program pulse is positive or negative.

Examples of a chalcogenide material suitable for storage material 106 may include indium (In)-antimony (Sb)-tellurium (Te) (IST) materials, such as $In_2Sb_2Te_5$, $In_1Sb_2Te_4$, $In_1Sb_4Te_7$, etc., and germanium (Ge)-antimony (Sb)-tellurium (Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. The hyphenated chemical composition notation, as used herein, indicates the elements included in a particular mixture or compound, and is intended to represent all stoichiometries involving the indicated elements.

As shown in FIG. 1A, a (e.g., horizontal) dielectric 108, such as aluminum oxide, hafnium oxide, etc., may be formed (e.g., flat deposited) over storage material 106, such as by CVD or ALD. In some examples, dielectric 108 may be about 0.1 nanometer to about one (1) nanometer thick.

A (e.g., horizontal) conductive material (e.g., a conductor 110), such as an electrode, may be formed (e.g., flat deposited) over dielectric 108, and a (e.g., horizontal) dielectric 114, such as an oxide or nitride, may be formed (e.g., flat deposited) over conductor 110. For example, a dielectric 108 may act as a barrier, such as a diffusion barrier, between a conductor 110 and storage material 106. Herein a conductive material may be referred to as a conductor.

In some examples, memory array 100 may include a stack of alternating (e.g., horizontal) stacks (e.g., tiers) 116 and dielectrics 114 between dielectric 104 and a (e.g., horizontal) dielectric 120. For example, each respective stack 116 and each respective dielectric 114 may alternate, where each respective stack 116 may include, for example, storage material 106, dielectric 108 over storage material 106, and conductor 110 over dielectric 108. Dielectric 120 may be over an uppermost stack 116. Dielectric 108 may be flat deposited over storage material 106, and conductor 110 may be flat deposited over dielectric 108 to form a stack 116, for example.

In an embodiment, storage material 106 may be formed over dielectric 104 or dielectric 114, as shown in FIG. 1A. For example, a stack 116 may be at each of a plurality of different levels in memory array 100. The stacks 116 may be separated from each other by a dielectric 114, as shown in FIG. 1A.

In some examples, the order of the formation of the storage material 106 and the conductor 110 may be inverted. For example, conductor 110 may be formed either over dielectric 104 or a dielectric 114, dielectric 108 may be formed over conductor 110, and storage material 106 may be formed over dielectric 108, and thus a dielectric 114 or dielectric 120 may be formed over storage material 106. As such, a dielectric stack 116 may, for example, include a conductor 110, a dielectric 108 over conductor 110, and storage material 106 over dielectric 108. For example, forming a dielectric stack 116 may include forming storage material 106, a dielectric 108, and a conductor 110 respectively at different levels within the stack 116, and thus at different levels within the array 100.

Figure 1B:
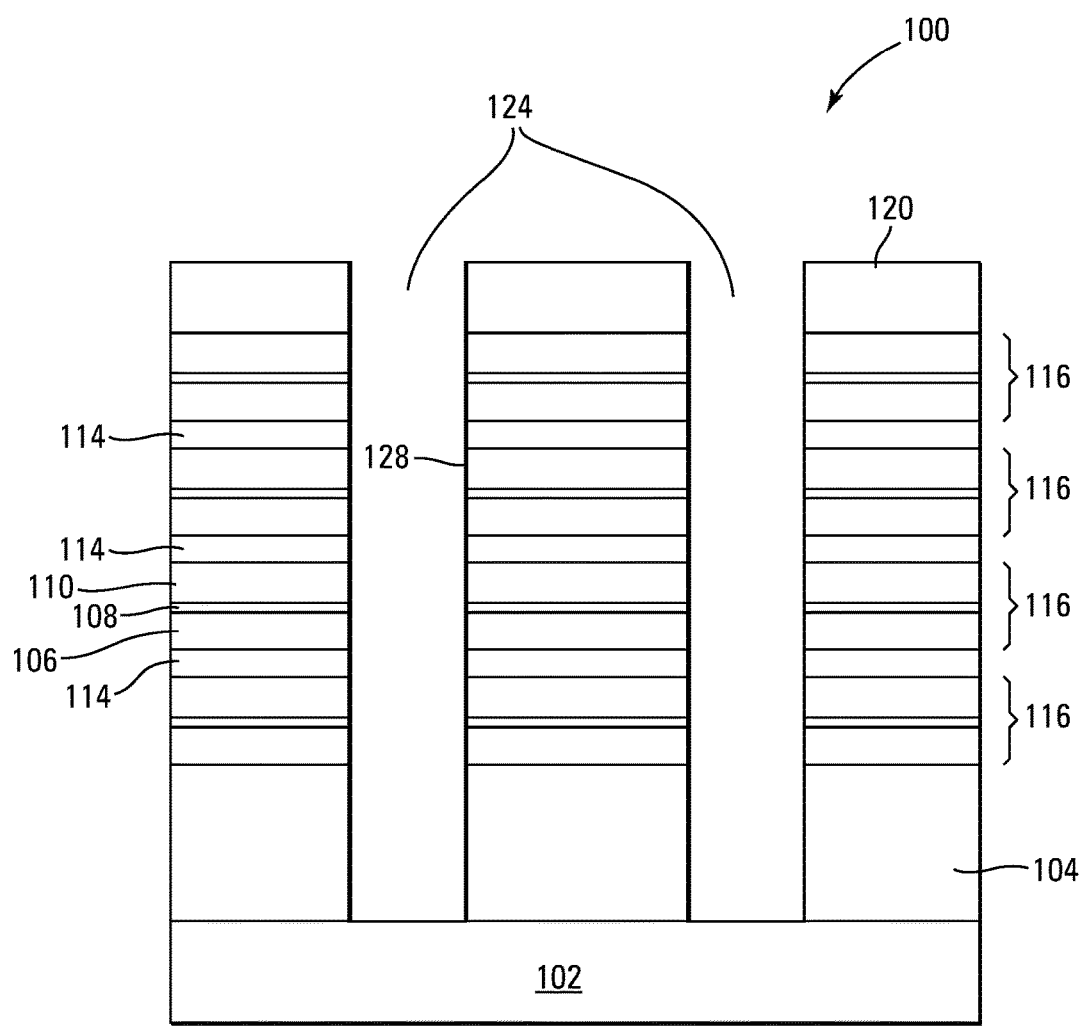

As shown in FIG. 1B, openings 124 may be formed through dielectric 120, through alternating stacks 116 and dielectrics 114, and through dielectric 104, stopping on or in dielectric 102. For example, dielectric 120 may be patterned to form openings 124 through dielectric 120, through alternating stacks 116 and dielectrics 114, and through dielectric 104. For example, a mask (not shown), such as imaging resist (e.g., photo-resist), may be formed over dielectric 120 and patterned to expose regions of dielectric 120. The exposed regions of dielectric 120 and portions of alternating stacks 116 and dielectrics 114 and portions of dielectric 104 under the exposed regions of dielectric 120 may be subsequently removed, such as by dry or wet etching, to form openings 124 that may terminate on or in dielectric 102.

Openings 124 may expose portions of dielectric 120, portions of dielectrics 114, portions of stacks 116 (e.g., portions of storage materials 106, dielectrics 108, and conductors 110), and portions of dielectric 104. For example, the exposed portions of dielectric 120, dielectrics 114, stacks 116, and dielectric 104 may be coplanar and contiguous and may form sides (e.g., sidewalls) 128 of openings 124. In an example, an exposed portion of a dielectric 120, a dielectric 114, a storage material 106, a dielectric 108, a conductor 110, and a dielectric 104 may form a bounding surface, such as a side, of the portion of the opening 124 passing though that dielectric 120, dielectric 114, storage material 106, dielectric 108, conductor 110, and dielectric 104. In some examples, openings 124 may have, circular, square, rectangular, polygonal, or oval cross-sections.

Figure 1C:
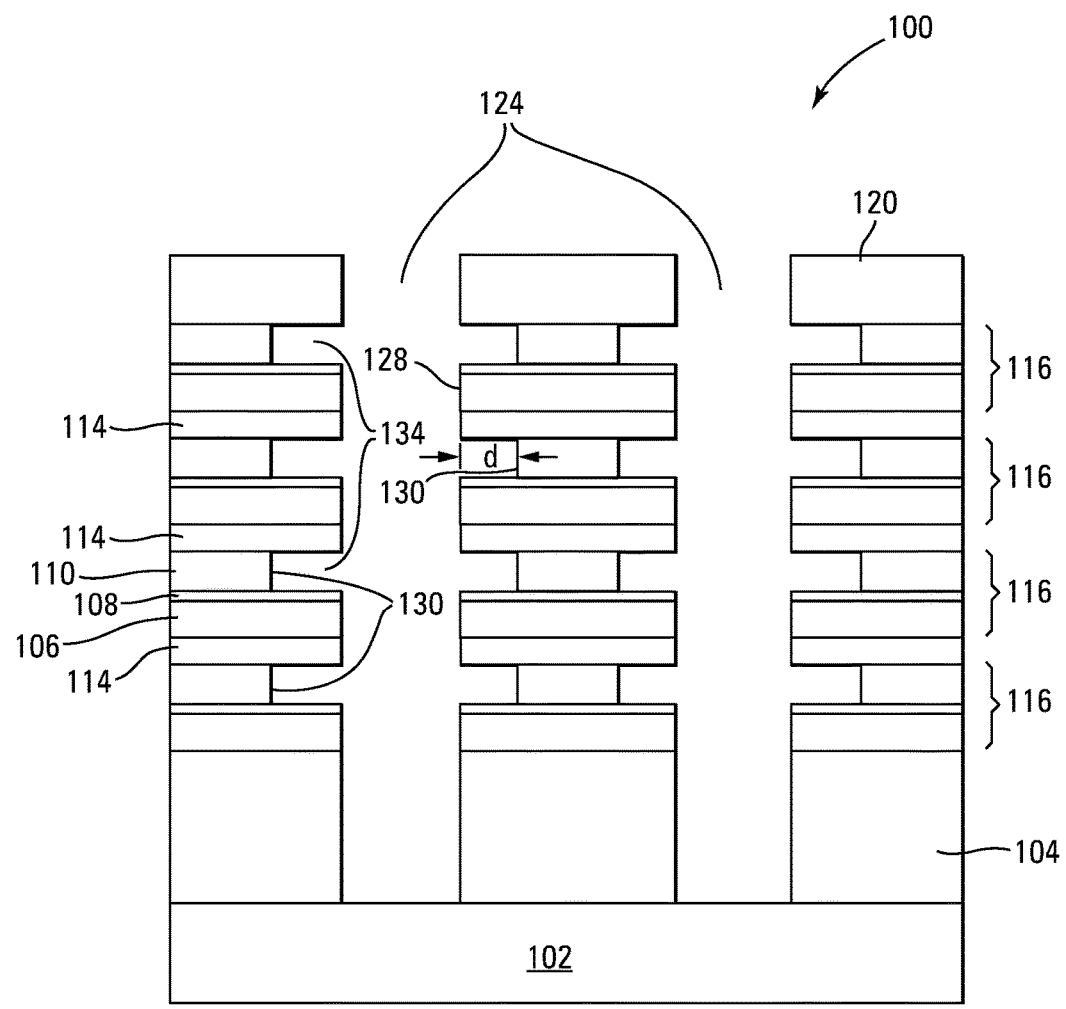

As shown in FIG. 1C, a portion of the conductor 110 in each of the respective stacks 116, and thus of each of the respective conductors 110, may be removed so that an exposed portion 130 of the conductor 110 in each of the stacks 116 may be recessed relative to the exposed portion of the storage material 106 and the exposed portion of dielectric 108 in each respective stack 116. For example, the portion 130 of a respective conductor 110 may be recessed relative to the side 128 of an opening 124, and thus the exposed portions of dielectrics 104, 114, and 120.

Recessing the portion 130 of a respective conductor 110 may form an opening (e.g., a recess) 134 that may extend from the side 128, and thus an exposed portion of a storage material 106, an exposed portion of a dielectric 108, an exposed portion of a dielectric 114, and an exposed portion of a dielectric 120, to the portion 130 of the conductor 110. For example, the openings 134 may be formed in the sides 128 of openings 124. The depth d of an opening 124 from a side 128 to a portion 130 illustrated in FIG. 1C may be about 10 to about 30 nanometers, for example. Note that the portion 130 of a conductor 110 may form a bounding surface, such as a side, of a respective opening 134. In some examples, openings 134 may be formed using an isotropic etch selective to conductors 110.

Figure 1D:
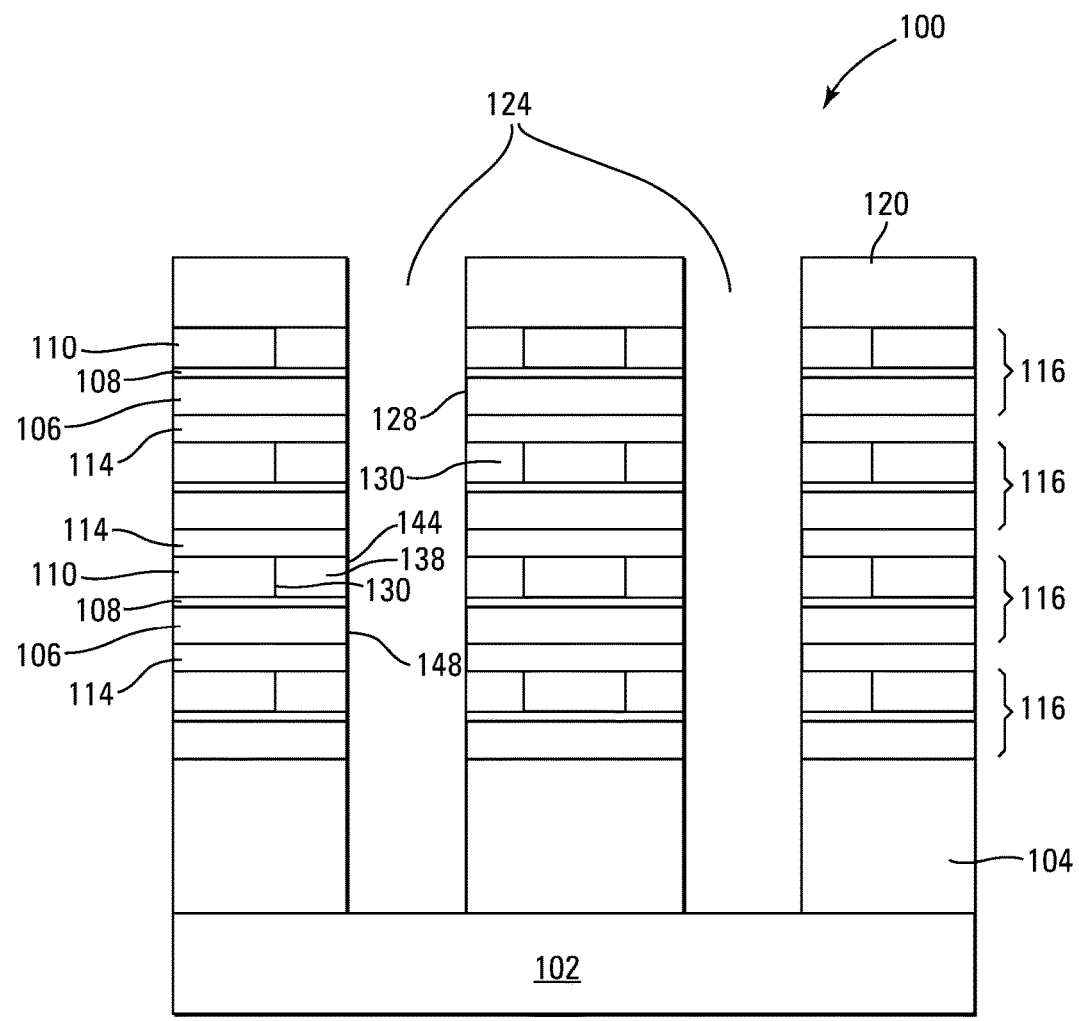

As shown in FIG. 1D, a dielectric 138, such as an oxide or a nitride, may be formed in each of the openings 134 adjacent to (e.g., in direct physical contact with) a respective portion 130 of each respective conductor 110. For example, a dielectric 138 may replace the removed portion of a respective conductor 110. In some examples, dielectric 138 may be formed in openings 124 and may be subsequently removed, such as by etching, until an exposed portion of the dielectric 138 in an opening 124 is coplanar (e.g., flush) with the side 128 of the opening 124, and thus the exposed portions of storage materials 106, dielectrics 108, dielectric 104, dielectrics 114, and dielectric 120.

In some examples, a dielectric, such as a dielectric similar to (e.g., the same as) a dielectric 108, may be formed in an opening 134 adjacent to a portion 130 of a conductor 110 (not shown). A dielectric 138 may then be formed in the opening 134 adjacent to the dielectric so that the dielectric is between the portion 130 of the conductor 110 and the dielectric 138.

The exposed portions of dielectrics 138, such as an exposed portion 144 of a dielectric 138, storage materials 106, such as an exposed portion 148 of a storage material 106, dielectrics 108, dielectric 104, dielectrics 114, and dielectric 120 may be coplanar and contiguous and may form the sides 128 of openings 124. For example, a side 128 may be a surface comprising coplanar and contiguous portions of dielectrics 138, storage materials 106, dielectrics 108, dielectric 104, dielectrics 114, and dielectric 120. Note that an exposed portion 144 of a dielectric 138 may form a bounding surface of a portion of the opening 124 passing through that dielectric 138.

A dielectric 138 in a stack (e.g., each stack) 116 may extend from a portion 130 of the conductor 110 of that stack to the exposed portion of the dielectric 108 and the exposed portion 148 of the charge storage material 106 of that stack 116. For example, a dielectric 138 (e.g., each dielectric 138) may extend from a portion 130 of a respective conductor 110 to the exposed portions of storage materials 106, dielectrics 108, dielectric 104, dielectrics 114, and dielectric 120.

Figure 1E:
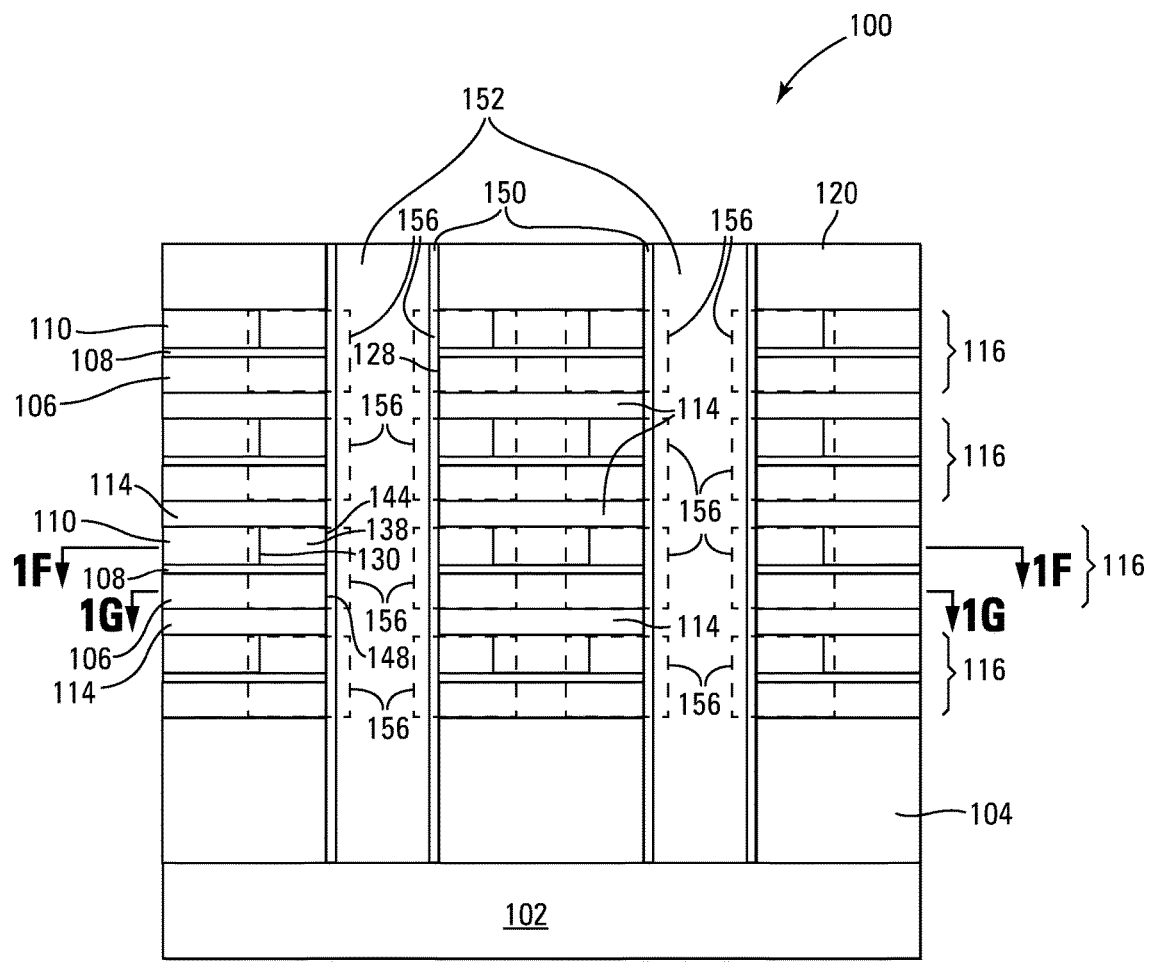
FIGS. 1E-1G illustrate various views of a processing step associated with forming a three dimensional memory array, in accordance with an embodiment of the present disclosure.

A (e.g., vertical) dielectric 150, such as a dielectric liner, may be formed in openings 124 adjacent to the sides 128 of those openings, as shown in FIG. 1E. For example, openings 124 may be lined with dielectric 150. Dielectric 150 may be formed adjacent to the exposed portions of dielectric 104, dielectrics 108, dielectrics 114, dielectric 120, dielectric 138, such as the exposed portion 144 of a respective dielectric 138, and storage materials 106, such as the exposed portion 148 of a respective storage material 106. In some examples, dielectric 150, may be similar to (e.g., the same as) dielectric 108, as described above.

Figure 1F:
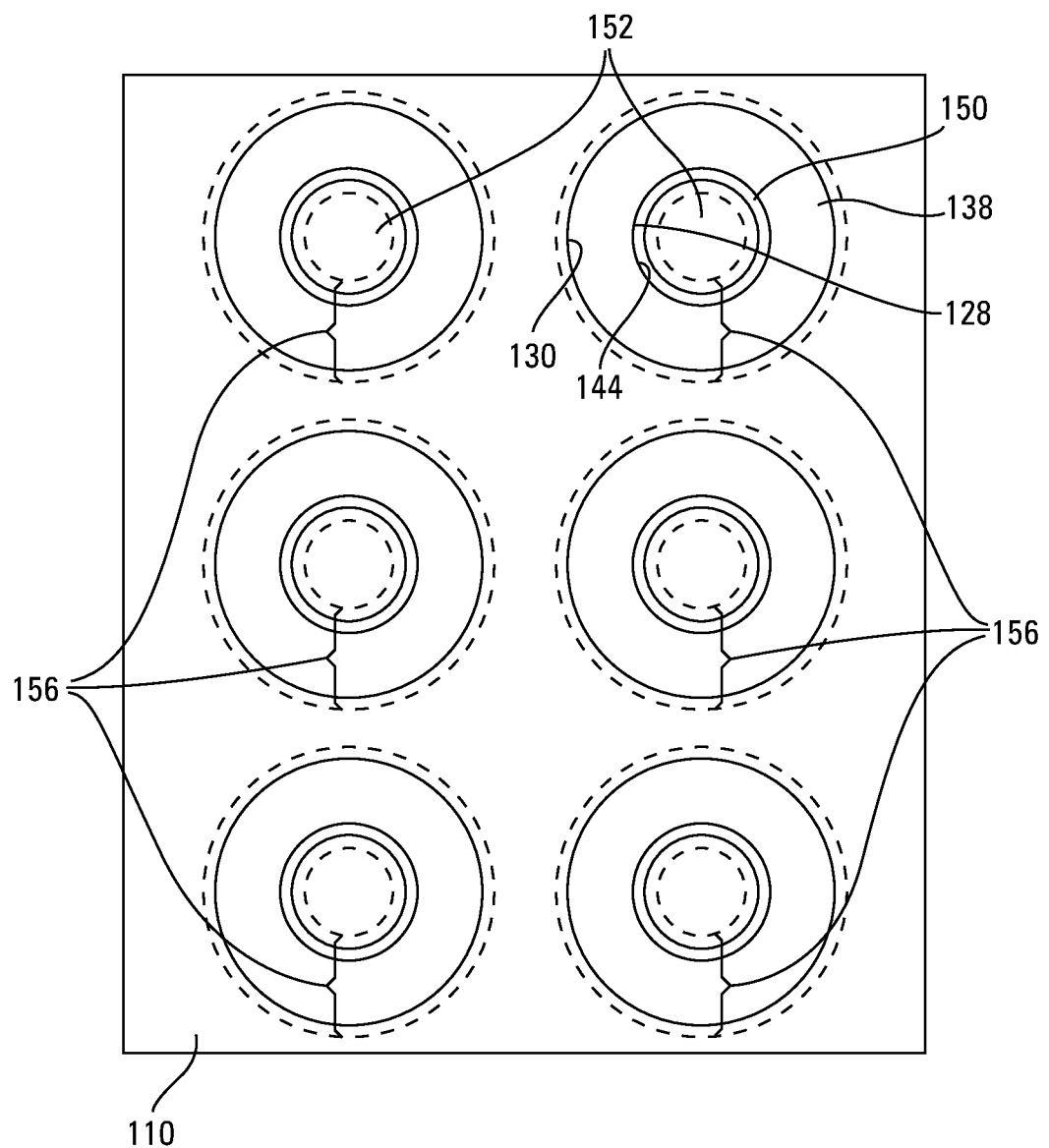
Figure 1G:
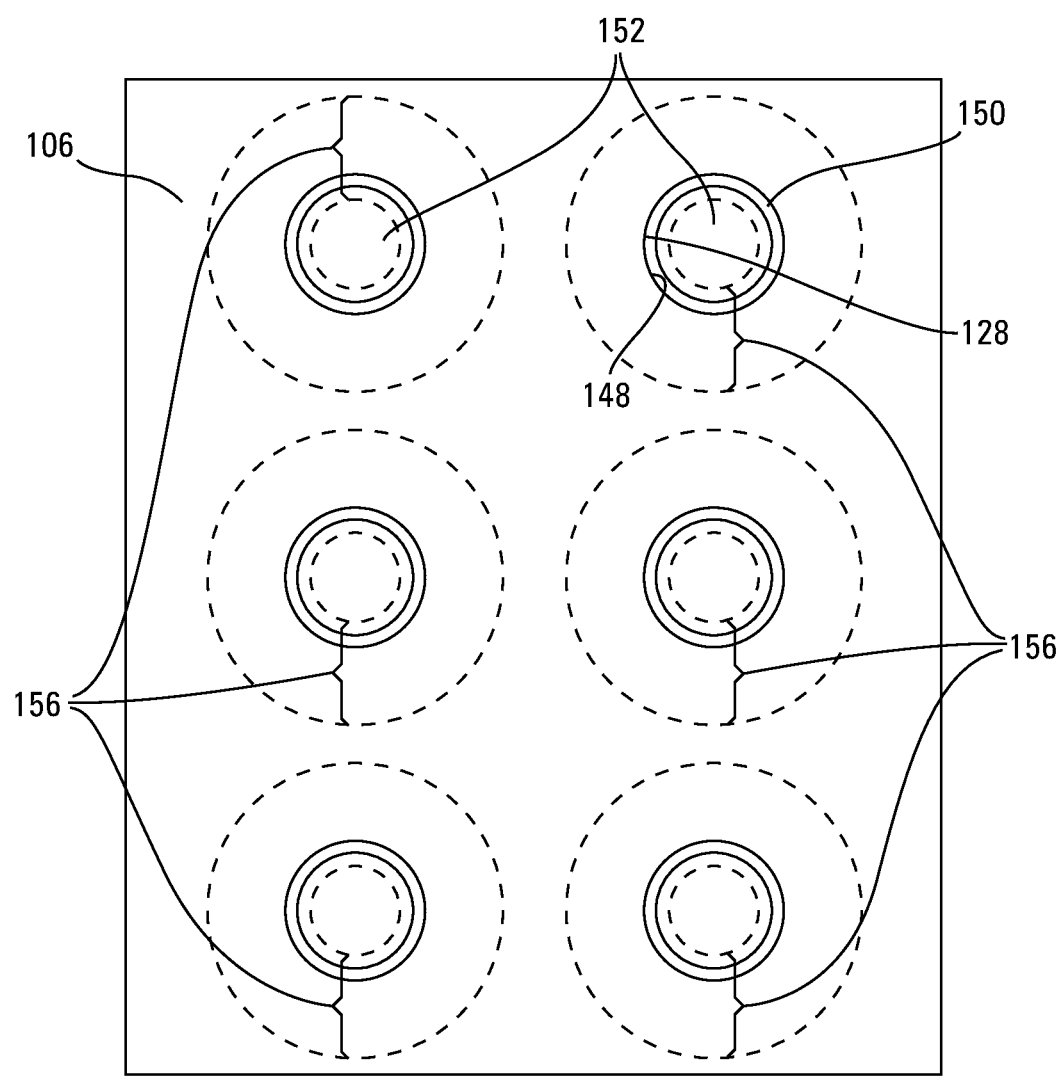

FIG. 1F illustrates a cross-sectional view taken along the line 1F-1F in FIG. 1E, and FIG. 1G illustrates a cross-sectional view taken along the line 1G-1G in FIG. 1E. FIGS. 1E and 1F show, for example, a dielectric 150 adjacent to (e.g., in direct physical contact with) a previously exposed portion 144 (e.g., exposed in FIG. 1D) of a respective dielectric 138. FIGS. 1E and 1F further show a dielectric 138 adjacent to a portion 130 of a conductor 110 and between the portion 130 and dielectric 150. FIG. 1G and FIG. 1E show, for example, a dielectric 150 adjacent to a previously exposed portion 148 (e.g., exposed in FIG. 1D) of a storage material 106.

A (e.g., vertical) conductor 152 (e.g., an electrode), such as a conductive pillar, may be formed in the openings containing (e.g., lined with) dielectric 150. For example, a conductor 152 may be formed adjacent to dielectric 150, as shown in FIGS. 1E-1G. In some examples, only a dielectric 150 and a conductor 152 or only a conductor 152 may be formed in an opening 124. Openings 124 may, for example, might not include (e.g., might be devoid of any) storage and/or switching materials, such as chalcogenide materials. For example, there might not be any storage and/or switching materials between side 128 and conductor 152. A conductor 152 may completely fill an opening 124 lined with a dielectric 150, for example. As previously described, it may be difficult to form storage and/or switching materials in an opening, such as an opening 124, (e.g., without having non-uniformities in the thicknesses of the storage and/or switching materials).

Dielectric 150 and conductor 152 may, for example, be perpendicular to stacks 116, and thus a conductor 110, dielectric 108, dielectric 138, and storage material 106 of each respective stack 116, dielectrics 104, 114, and 110, and a base structure. For example, dielectric 150 and/or conductor 152 may pass through the stack of alternating dielectrics 114 and stacks 116. Conductor 152 may be adjacent to dielectric 150 such that dielectric 150 is between conductor 152 and the alternating dielectrics 114 and stacks 116. In some examples, the conductor 138 in each respective stack 116 may be between a conductor 110 of each respective stack 116 and conductor 152.

In an embodiment, a dielectric 150 may be (e.g., formed) completely around a conductor 152, as shown in FIGS. 1F and 1G. A dielectric 138 may be completely around a dielectric 150, and thus conductor 152, and a portion of a conductor 110 may be completely around dielectric 138. For example, a conductor 152, a dielectric 150, a dielectric 138, and a portion of a conductor 110 may be concentric, as shown in FIG. 1F. A portion of a storage material 106 may be completely around a dielectric 150, and thus a conductor 152, as shown in FIG. 1G. For example, a conductor 152, a dielectric 150, and a portion of a storage material 106 may be concentric, as shown in FIG. 1G.

In some examples, conductors 110 and/or conductors 152 may comprise, consist of, or consist essentially of conductively doped polysilicon and/or may comprise, consist of, or consist essentially of metal, such as a refractory metal, or a metal-containing material, such as a refractory metal silicide, or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

A portion of a dielectric 108 may be completely around a dielectric 150, and thus a conductor 152, in a manner similar to that shown for storage material 106 in FIG. 1G. For example, a conductor 152, a dielectric 150, and a portion of a dielectric 108 may be concentric.

A portion of a dielectric 114 may be completely around a dielectric 150, and thus a conductor 152, in a manner similar to that shown for storage material 106 in FIG. 1G. For example, a conductor 152, a dielectric 150, and a portion of a dielectric 114 may be concentric.

In some examples, a stack 116 (e.g., each of stacks 116) may include a portion of memory cell 156. For example, each respective memory cell 156 may include a portion of a respective storage material 106, a portion of a respective conductor 110 (e.g., on the portion of the respective storage material 106), a portion of a respective dielectric 138 (e.g., on the portion of the respective storage material 106), a different portion of a dielectric 150, and a different portion of a conductor 152, as shown in FIGS. 1E-1G. A memory cell (e.g., each memory cell) 156 may, for example, be annular in shape, as shown in FIGS. 1F and 1G. In some examples, a portion of a respective dielectric 108 may be between the portion of the respective storage material 106 and the portion of a respective conductor 110 and between the portion of the respective storage material 106 and the portion of a respective dielectric 138, as shown in FIG. 1E. In an example, the portion of a respective dielectric 138 may be between the portion of a respective conductor 110 and the different portion of the dielectric 150, and thus the different portion of the conductor 152.

A memory cell 156 may be in a respective tier (e.g., a deck) of memory cells, where different tiers of memory cells 156 may be at different (e.g., vertical) levels within memory array 100 to form a stack of memory cells 156. For example, a memory cell (e.g., each memory cell) 156 may correspond to a respective stack 116. A respective memory cell 156 may, for example, include a portion of a respective conductor 110 and a portion of a respective dielectric 138 at a level in a respective stack 116, and thus memory array 100, a portion of a respective dielectric 108 at another level in the respective stack 116, and portion of a respective storage material 106 at yet another level in the respective stack 116. Each respective memory cell 156 and each respective dielectric 114 may alternate so that the memory cells 156 are separated from each other be a dielectric 114. Although FIGS. 1A-1E show four stacks 116 and four tiers of memory cells 156, memory array 100 is not so limited and may include any number of stacks 116 and tiers of memory cells 156.

In some examples, a conductor 110 may be a signal line (e.g., plane), such as an access line (e.g., a word line), and a conductor 152 may be a signal line (e.g., an access line), such as a data line (e.g., a bit line). In some examples, the storage material 106, and thus a respective memory cell 156, may be self-selecting. For example, the storage material 106 may act as a switch, such as a diode, and a storage element.

The length of a dielectric 138 in each respective stack 116 may define an effective length of a respective memory cell 156. For example, the length of a dielectric 138, and thus the effective length of each respective memory cell 156, may be about 10 to about 30 nanometers. In some examples, the effective length of each respective memory cell 156 may be about the depth d of an opening 124, shown in FIG. 1C.

In an example, a relatively low voltage (e.g., a negative voltage) may be applied to a conductor 152, and a relatively high voltage (e.g., a positive voltage) may be applied to a conductor 110 to produce a voltage differential across a storage material 106, and thus the memory cell 156 that includes that storage material 106. The voltage differential may act to produce a conductive (e.g., a current) path from the conductor 110 to the conductor 152 that may include a dielectric 108, the storage material 106, and a dielectric 150. For example, the current may flow from conductor 110 through dielectric 108, the storage material 106, the dielectric 150 to the conductor 152. For example, dielectrics 108 and dielectric 150 may be sufficiently thin to pass current. In some examples, such a voltage differential may act to program a threshold voltage, and thus a state, in the respective storage material 106, and thus the respective memory cell 156. The polarity of the voltage differential may be reversed, in some examples, to program a different threshold voltage, and thus a different state, in the respective storage material 106, and thus the respective memory cell 156.

Figure 2:
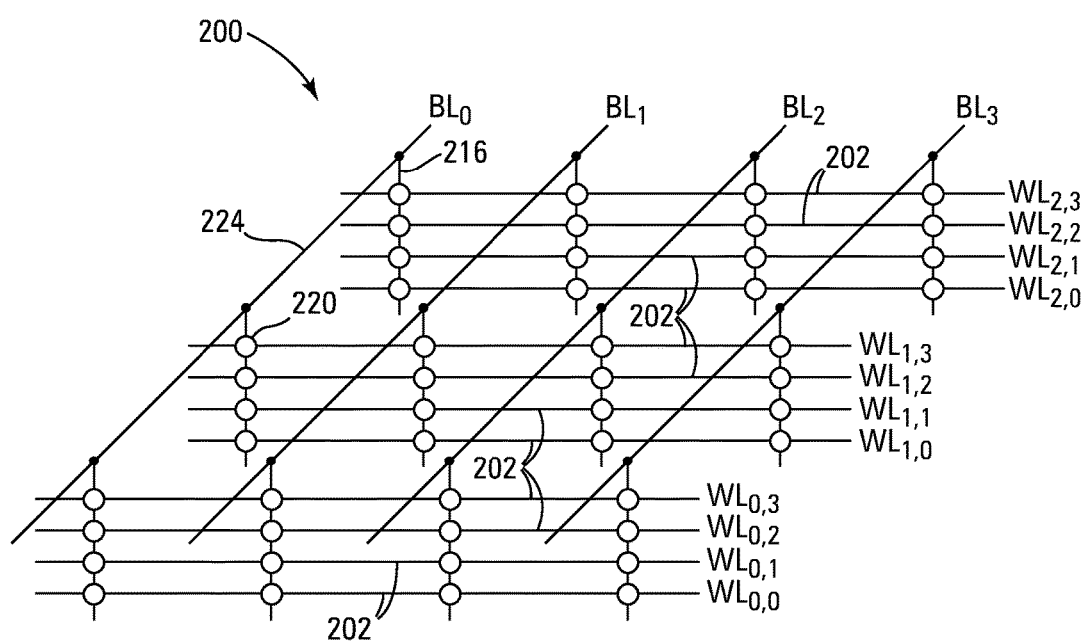
FIG. 2 illustrates a three dimensional memory array in accordance with an embodiment of the present disclosure.

FIG. 2 illustrates a three dimensional memory array 200 in accordance with an embodiment of the present disclosure. Array 200 may be, for example, array 100 previously described in connection with FIGS. 1E-1G. For example, array 200 may be processed according to the processing steps previously described herein (e.g., in connection with FIGS. 1A-1G).

As shown in FIG. 2, access lines, which may be referred to as word lines (WLs), may be located on a plurality of levels. For example, word lines may be located on N levels. Insulation material (not shown in FIG. 2 for clarity and so as not to obscure embodiments of the present disclosure) can separate the levels of word lines. As such, the levels of word lines separated by insulation material can form a stack of WL/insulation materials. In some examples, each word line may include (e.g., may be) a respective conductor 110, shown in FIGS. 1E and 1F. In some examples, each respective word line may be in a respective stack, such as a stack 116 previously described in connection with FIGS. 1A-1E, that may include a word line and a storage material, such as storage material 106 previously described in connection with FIGS. 1A-1E, at a different level than the word line.

Further, data lines, which may be referred to as bit lines (BLs), may be, for example, arranged perpendicular to the word lines, and located at a level above the N levels of word lines (e.g., at the N+1 level). In some examples, each bit line may include to a conductor (e.g., a vertical conductor), such as a conductor 152 shown in FIGS. 1E-1G.

For example, array 200 may include a plurality of conductive lines 202 (e.g., access lines), which may be referred to herein as word lines, and a plurality of conductive lines 224 (e.g., data lines), which may be referred to herein as bit lines. Word lines 202 may be arranged into a number of levels. Word lines 202 are shown being arranged into four levels in FIG. 2. However, the quantity of levels into which the word lines 202 may be arranged are not limited to this quantity, and word lines 202 may be arranged into more, or fewer, levels. Word lines 202 may be arranged parallel one another within a particular level. For example, word lines 202 in each of the multiple levels may be located at a same relative location within each level so as to be aligned with word lines 202 directly above and/or below. Storage material (e.g., storage material 106 previously described in connection with FIGS. 1A-1G) may be located between the word lines at the different levels to form stacks (e.g., the stacks 116 previously described in connection with FIGS. 1A-1E) that may include a respective word line and the respective storage material 106. Insulation material (e.g., a dielectric 114 previously described in connection with FIGS. 1A-1E) may be located between the levels at which stacks are located.

As shown in FIG. 2, bit lines 224 may be arranged parallel one another at a level different than the levels at which word lines 202 are located (e.g., above the levels at which word lines 202 are located). For example, the bit lines may be located at the top of the memory array 200, as illustrated in FIG. 2. As an additional example, the bit lines may be located at the bottom of array 200 (e.g., such that conductors 152 may be coupled to (e.g., contact) the bit lines at the bottom of openings 124). The bit lines 224 may be further arranged perpendicular (e.g., orthogonal) to word lines 202 so as to have overlappings (e.g., crossings at different levels) therebetween. However, embodiments of the present disclosure are not limited to a strictly parallel/orthogonal configuration.

The indices shown for each word line 202 in FIG. 2 indicate the position (e.g., ordering) of the word lines within a group of word lines. For example, word line $WL_{2,0}$ is shown being located at a position 2 at the bottom of the group of word lines, and word line $WL_{2,3}$ is shown being located at position 2 at the top of the group of word lines. The quantity of levels into which the word lines 202 may be arranged, and the quantity of word lines 202 at each level may be more, or fewer, than the quantities shown in FIG. 2.

At each overlapping of a bit line 224 and a group of word lines 202, a conductor 152 of a bit line 224 may be oriented substantially perpendicular to the bit line 224 and the word lines 202, so as to intersect a portion of each word line 202 in the group of word lines.

For example, the conductor 152 of the bit line 224 may be arranged to extend vertically from the bit line 224 to intersect a portion the respective word lines 202 therebelow, as shown in FIG. 2. For instance, as one example, the conductor 152 can pass through a stack 116, including a word line 202 and a storage material 106, so as to be surrounded entirely by the word line 202 and the storage material 106. In some examples, a stack 116 may include a portion of a memory cell 220. For example, a memory 220 may include a portion of a word line 202, a portion of storage material 106 at a different level than the portion of word line 202, and a portion of a conductor 152.

Memory cells 220 are shown in FIG. 2 arranged in a three dimensional architecture near the location of where a conductor 152 of a bit line 224 and the stacks 116 are in proximity to one another at different levels. For example, a memory cell 220 may be located where a conductor 152 passes through a portion of a stack 116.

The memory cells 220, for example, may be arranged in multiple levels, each level having memory cells at intersections of conductors, such as conductors 152, and stacks 116 that include a portion of a word line 202 and a portion of a storage material 106. The levels of memory cells 220 may be formed at different levels from one another, thereby being vertically stacked. Accordingly, memory array 200 may be a three dimensional memory array that may include memory cells 220 having a common bit line 224, but separate word lines 202. Although four levels of word lines 202 (and four corresponding levels of memory cells 220) are shown in FIG. 2, embodiments of the present disclosure are not so limited and can include more, or fewer, levels of word lines 202 (and corresponding levels of memory cells 220).

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A memory array, comprising:
a plurality of first dielectric materials and a plurality of stacks, wherein each respective first dielectric material and each respective stack alternate, and wherein each respective stack comprises a first conductive material and a storage material on only one side of the first conductive material;
a second conductive material passing through the plurality of first dielectric materials and the plurality of stacks such that a major axis of the second conductive material is perpendicular to a major axis of the storage material; and
a second dielectric material in direct physical contact with the second conductive material and passing through the plurality of first dielectric materials and the plurality of stacks between the second conductive material and the plurality of stacks;
wherein each respective stack further comprises a third dielectric material between the first conductive material and the second dielectric material such that the storage material of the respective stack is on only one side of the third dielectric material, the second dielectric material is between the second conductive material and the third dielectric material, and the third dielectric material is in direct physical contact with the first conductive material and the second dielectric material.

2. The memory array of claim 1, wherein the storage material is in direct physical contact with the second dielectric material.

3. The memory array of claim 1, wherein the second dielectric material is in direct physical contact with the plurality of first dielectric materials.

4. The memory array of claim 1, wherein each respective stack further comprises a fourth dielectric material between the first conductive material and the storage material.

5. The memory array of claim 1, wherein the first conductive material and the storage material are at different levels within each respective stack.

6. The memory array of claim 1, wherein the major axis of the second conductive material is perpendicular to major axes of the plurality of first dielectric materials.

7. The memory array of claim 1, wherein the storage material is a self-selecting storage material.

8. The memory array of claim 1, wherein the storage material is formed around the second conductive material.

9. The memory array of claim 1, wherein the storage material comprises a chalcogenide material.

10. A memory array, comprising:
a stack of memory cells;
a first dielectric material; and
a first conductive material in direct physical contact with the first dielectric material;
wherein each respective memory cell comprises:
a respective portion of the first conductive material;
a respective portion of the first dielectric material;
a second conductive material;
a storage material on only one side of the second conductive material such that a major axis of the first conductive material is perpendicular to a major axis of the storage material; and
a second dielectric material between the second conductive material and the first dielectric material such that the storage material is on only one side of the second dielectric material, the first dielectric material is between the first conductive material and the second dielectric material and the second dielectric material is in direct physical contact with the first dielectric material and the second conductive material.

11. The memory array of claim 10, wherein the memory cells are separated from each other by an additional dielectric material.

12. The memory array of claim 10, wherein the first dielectric material is between the first conductive material and the storage material.

13. The memory array of claim 10, wherein each respective memory cell comprises an additional dielectric material between the second dielectric material and the storage material.

14. The memory array of claim 13, wherein the additional dielectric material is between the second conductive material and the storage material.

15. The memory array of claim 10, wherein the storage material of each respective memory cell is to form a conductive path between the first conductive material and the second conductive material.

16. The memory array of claim 10, wherein the major axis of the first conductive material is perpendicular to a major axis of the second conductive material.

17. The memory array of claim 10, wherein the second conductive material and the storage material of each respective memory cell are formed around the first conductive material.

18. The memory array of claim 1, wherein a surface of the charge storage material, in each respective stack, that is in direct physical contact with the second dielectric material is coplanar with a surface of the third dielectric material, in each respective stack, that is in direct physical contact with the second dielectric material.

* * * * *